United States Patent
Schoenfeld et al.

(10) Patent No.: US 6,941,526 B2
(45) Date of Patent: Sep. 6, 2005

(54) LOW POWER BUFFER IMPLEMENTATION

(75) Inventors: Aaron Schoenfeld, Boise, ID (US);
Greg A. Blodgett, Nampa, ID (US);
Timothy B. Cowles, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/898,550

(22) Filed: Jul. 26, 2004

(65) Prior Publication Data

US 2005/0114803 A1    May 26, 2005

Related U.S. Application Data

(63) Continuation of application No. 10/175,857, filed on Jun. 21, 2002, now Pat. No. 6,816,994.

(51) Int. Cl.[7] .............................................. G06F 17/50

(52) U.S. Cl. .................................. 716/1; 716/3; 716/6

(58) Field of Search .... 716/1–6, 16–18; 365/226–227; 327/55, 143

(56) References Cited

U.S. PATENT DOCUMENTS

| | | | | |
|---|---|---|---|---|
| 5,392,221 A | * | 2/1995 | Donath et al. | 716/6 |
| 5,526,318 A | * | 6/1996 | Slemmer et al. | 365/226 |
| 5,896,338 A | * | 4/1999 | Landgraf et al. | 365/226 |
| 6,256,252 B1 | * | 7/2001 | Arimoto | 365/227 |
| 6,281,723 B1 | * | 8/2001 | Tailliet | 327/143 |
| 2003/0117875 A1 | | 6/2003 | Lee et al. | |

OTHER PUBLICATIONS

Two Novel Fully Complementary Self-Biased CMOS Differential Amplifiers, Mel Bazes, IEEE Journal of Solid-State Circuits, vol. 26, No. 2, Feb. 1991, pp. 165-168.

* cited by examiner

Primary Examiner—Vuthe Siek
Assistant Examiner—Binh Tat
(74) Attorney, Agent, or Firm—Dickstein Shapiro Morin & Oshinsky LLP

(57) ABSTRACT

A lower current input buffer is used for waking up a plurality of higher-current buffers. The lower current buffer monitors a wake-up signal and, when present, enables the higher current buffers. A higher current buffer is used to detect the sleep mode and disable the higher current buffers. A delay circuit may be used to balance the propagation delay through the circuit.

30 Claims, 7 Drawing Sheets

LOW POWER BUFFER IMPLEMENTATION

This application is a continuation of U.S. patent application Ser. No. 10/175,857, filed Jun. 21, 2002 now U.S. Pat. No. 6,816,994. the entire disclosure of which is incorporated herein by reference and claims priority thereto.

FIELD OF THE INVENTION

The invention relates to buffers which are used to detect transitions in the power-consumption mode of an electronic device.

BACKGROUND OF THE INVENTION

Some electronic memory and processor devices have a low-power consumption or "sleep" mode in which a circuit within an electronic device temporarily shuts down during relatively long periods of unuse. Buffers are used to detect when it is necessary to "wake up" and restore power to the device. These buffers tend to be fast buffers with a symmetrical response because such buffers are advantageously used in other parts of a memory and/or processor device where high speed symmetrical switching is required. However, such symmetry is not always necessary during the condition when power is restored to a circuit, because a restore-power event is relatively rare and is not timing-critical. Additionally, fast buffers with symmetrical response tend to be complex and consume large amounts of power. Accordingly, use of such a buffer to detect a "wake up" condition tends to consume a large amount of power when the device is in the sleep mode.

BRIEF SUMMARY OF THE INVENTION

In one aspect, the invention provides a less complex and lower power buffer for detecting a "wake up" condition and which enables a plurality of high current buffers which are respectively connected to a plurality of signal lines. The high current buffers are disabled when in a sleep mode and are enabled by the low power buffer detecting the "wake up" condition.

In another aspect, the invention provides a method of determining when an electronic device should be enabled in a "wake-up" condition, including the steps of monitoring a line which indicates a wake-up condition with a low-power buffer; and enabling a plurality of high-current buffers when a wake-up condition is detected.

In yet another aspect, the invention provides a structure and method which uses a combination of a higher power high current buffer for detecting when a sleep mode is entered, and a lower power buffer for detecting a wake-up condition. The buffer combination is used to disable and enable a plurality of high current buffers.

BRIEF DESCRIPTION OF THE DRAWING

The foregoing and other features and advantages of the invention will become more apparent from the detailed description of the exemplary embodiments of the invention given below in connection with the accompanying drawings in which.

DETAILED DESCRIPTION OF THE INVENTION

Figure 1:
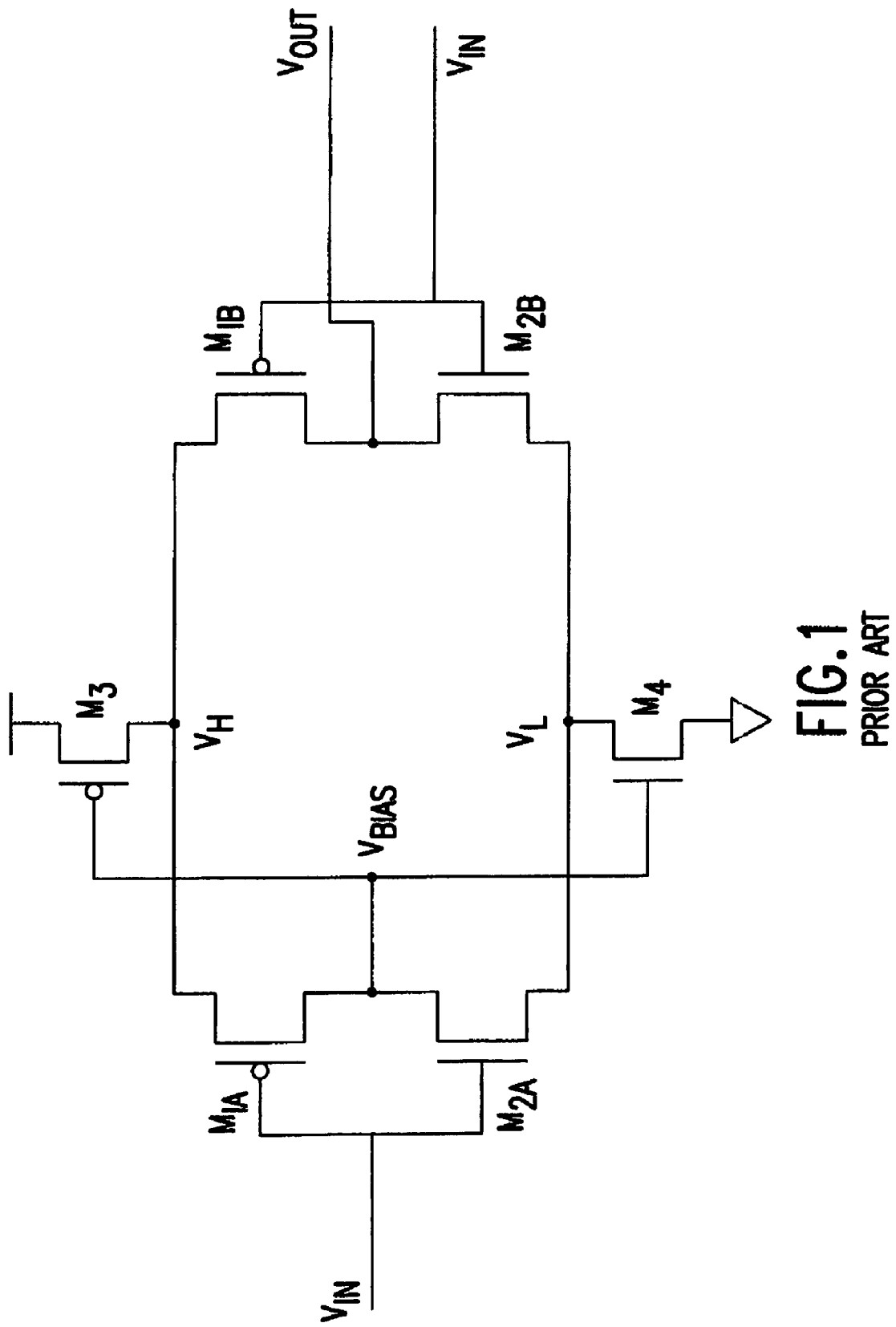
FIG. 1 is a schematic diagram of a conventional high speed differential buffer.

As stated, to save power, electronic devices sometimes go into "sleep" mode, during which time many of the electronic elements within the device are disabled. However, even in "sleep" mode, one buffer must still remain enabled in order to detect when a system transitions out of sleep mode. Various types of differential input buffers are often used to perform this monitoring because they are commonly employed in electronic devices and are known to sense both low-to-high and high-to-low transitions equally, symmetrically, and with high speed. They do so by combining p- and n-channel differential amplifiers into a single complementary buffer amplifier, an example of which is shown in FIG. 1. There, transistors $M_{1A}$ and $M_{1B}$ form the p-channel portion of a differential amplifier, while transistors $M_{2A}$ and $M_{2B}$ form the n-channel portion. FIG. 1 shows that the drains of transistors $M_{1A}$, $M_{2A}$, and the drains of transistors $M_{1B}$, and $M_{2B}$, are connected together. Transistors $M_3$ and $M_4$ are bias transistors which supply the bias voltages $V_H$ and $V_L$ to the remainder of the circuit.

In order for the circuit of FIG. 1 to be biased in a stable fashion, the currents through transistors $M_3$ and $M_4$ should be identical. Any difference in currents through these two devices would result in shifts in amplifier bias voltages and buffer switching characteristics. However, achieving perfect equality of currents in these two devices using external biasing is difficult. Instead, the gates of transistor $M_3$ and $M_4$ are connected to the internal amplifier node $V_{BIAS}$. This self-biasing creates a negative-feedback loop that stabilizes the bias voltages $V_H$, $V_L$. Additionally, any variations in processing parameters or operating conditions that shift the bias voltages away from their nominal values result in a shift in $V_{BIAS}$ that corrects the bias voltages through negative feedback.

In the high speed differential amplifier of FIG. 1, devices $M_3$ and $M_4$ operate in the linear region. Consequently, the voltages $V_H$ and $V_L$ may be set very close to the supply voltages. Since these two voltages determine the output swing of the amplifier, the output swing can be very close to the difference between the two supply rails. This large output swing simplifies interfacing the high speed amplifier to other types of logic gates, since it provides a large margin for variations in the logic threshold of the gates.

Another consequence of the linear range operation of devices $M_3$ and $M_4$ is that the high speed amplifier can provide output switching currents that are significantly greater than its quiescent current. In contrast, conventional CMOS differential amplifiers cannot provide switching currents that exceed the quiescent current set by the current-source drive, which operates in the saturation region. This capability of supplying momentarily large current pulses makes this amplifier especially suitable for high-speed comparator applications where one of the inputs Vin is a reference voltage, and where it is necessary to rapidly charge and discharge output capacitive loads without consuming inordinate amounts of power. High speed buffers such as that shown in FIG. 1 detect transitions faster, symmetrically, and with less distortion than other buffers. These are very desirable characteristics for high speed input buffers such as differential input buffers for memory devices and processors. Unfortunately, high speed buffers have the disadvantage that they consume a large amount of current.

Figure 2:
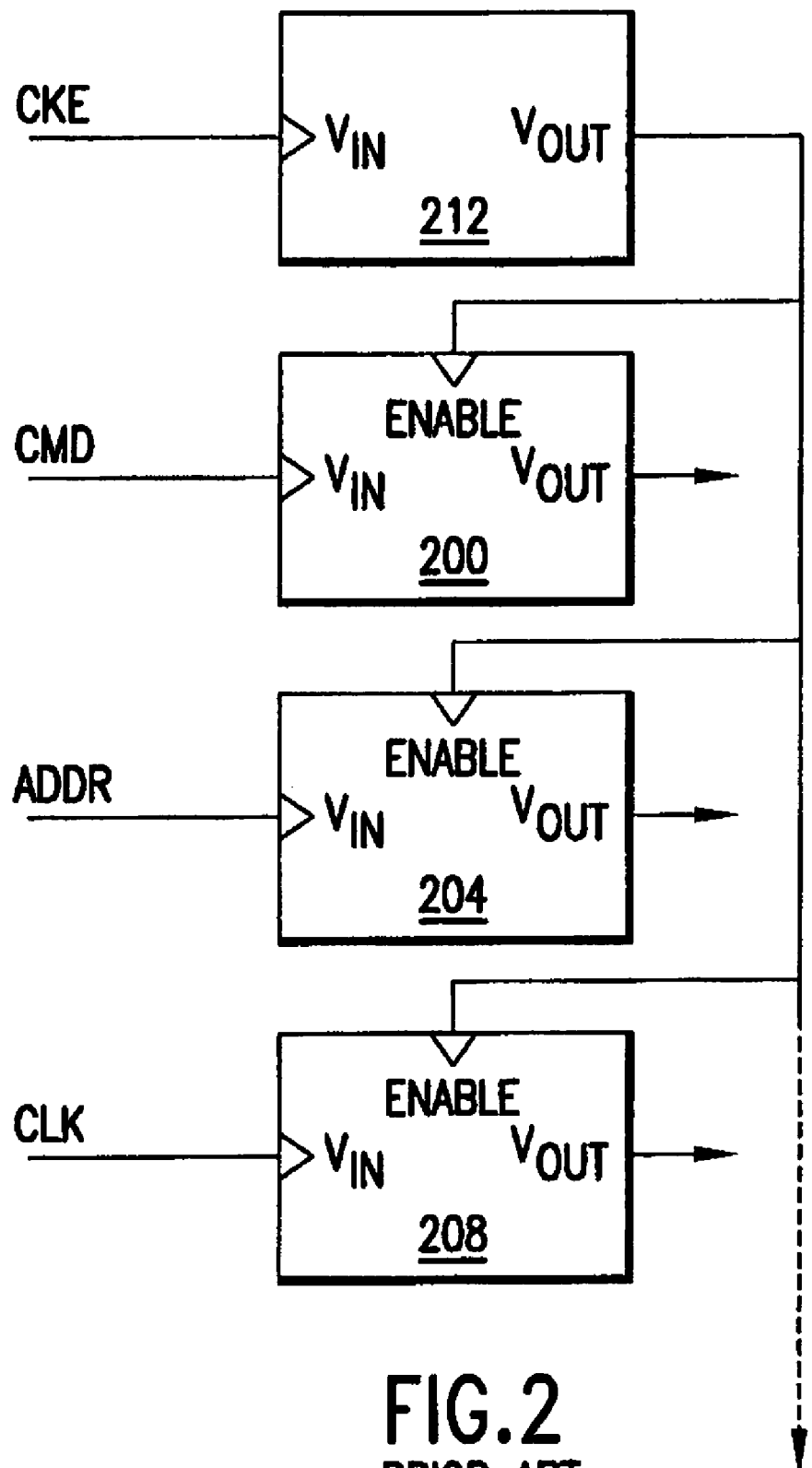
FIG. 2 is a schematic diagram depicting a series of high speed buffers connected in conventional fashion to another high speed buffer which monitors a clock enable (CKE) line.

FIG. 2 is a schematic diagram of a conventional memory device "wake-up" circuit which uses a group of high speed buffers 200, 204, and 208 each buffering various signal lines typically found within a memory device, such as command (CMD), address (ADDR), and clock (CLK) signal lines. Although only one of each signal is shown in FIG. 2 it should be understood that at least some of these signals actually encompass multiple lines, and that each such line has an associated high speed buffer. During power-off conditions, it is desired to shut off the power-consuming high speed buffers, and turn them back on when power is restored. Accordingly, the clock enable (CKE) signal line in FIG. 2 is used to signify that power is being cut from or restored to the circuit, thereby shutting down or waking up the various high speed buffers 200, 204, and 208. In the FIG. 2 circuit, one sentinel high speed buffer 212 must remain on at all times even during power down (thereby consuming power), to monitor the CKE line to detect when power is restored, turn on (enable) the rest of the buffers 200, 204, and 208, and return the entire buffer circuit back into operation. Thus, even when the FIG. 2 circuit is in the sleep mode, at least one high current high speed buffer remains in operation to detect the CKE signal transition and wake up (enable) the other three high speed buffers 200, 204, and 208.

Figure 3:
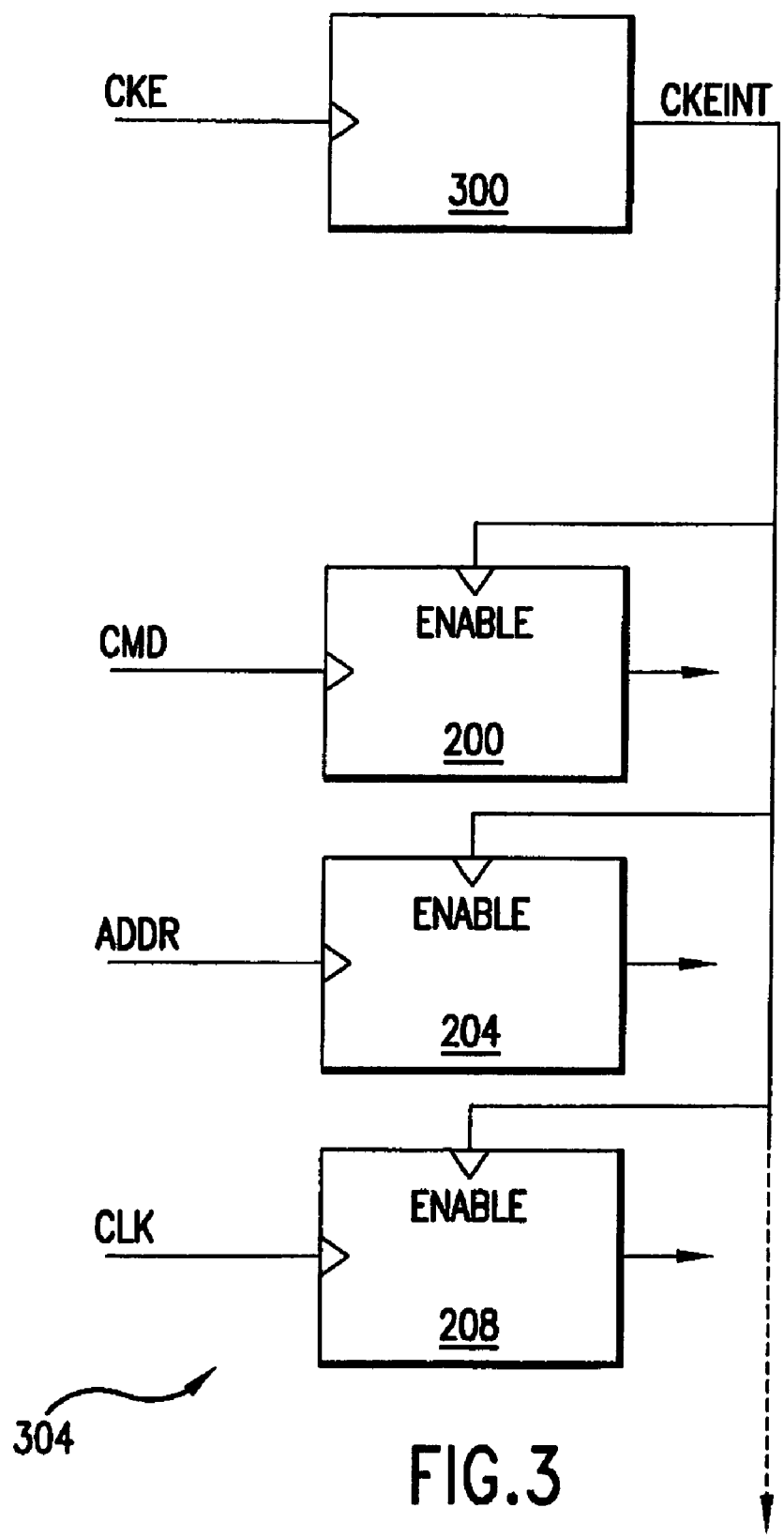
FIG. 3 is a block diagram depicting a first embodiment of the present invention.
Figure 4:
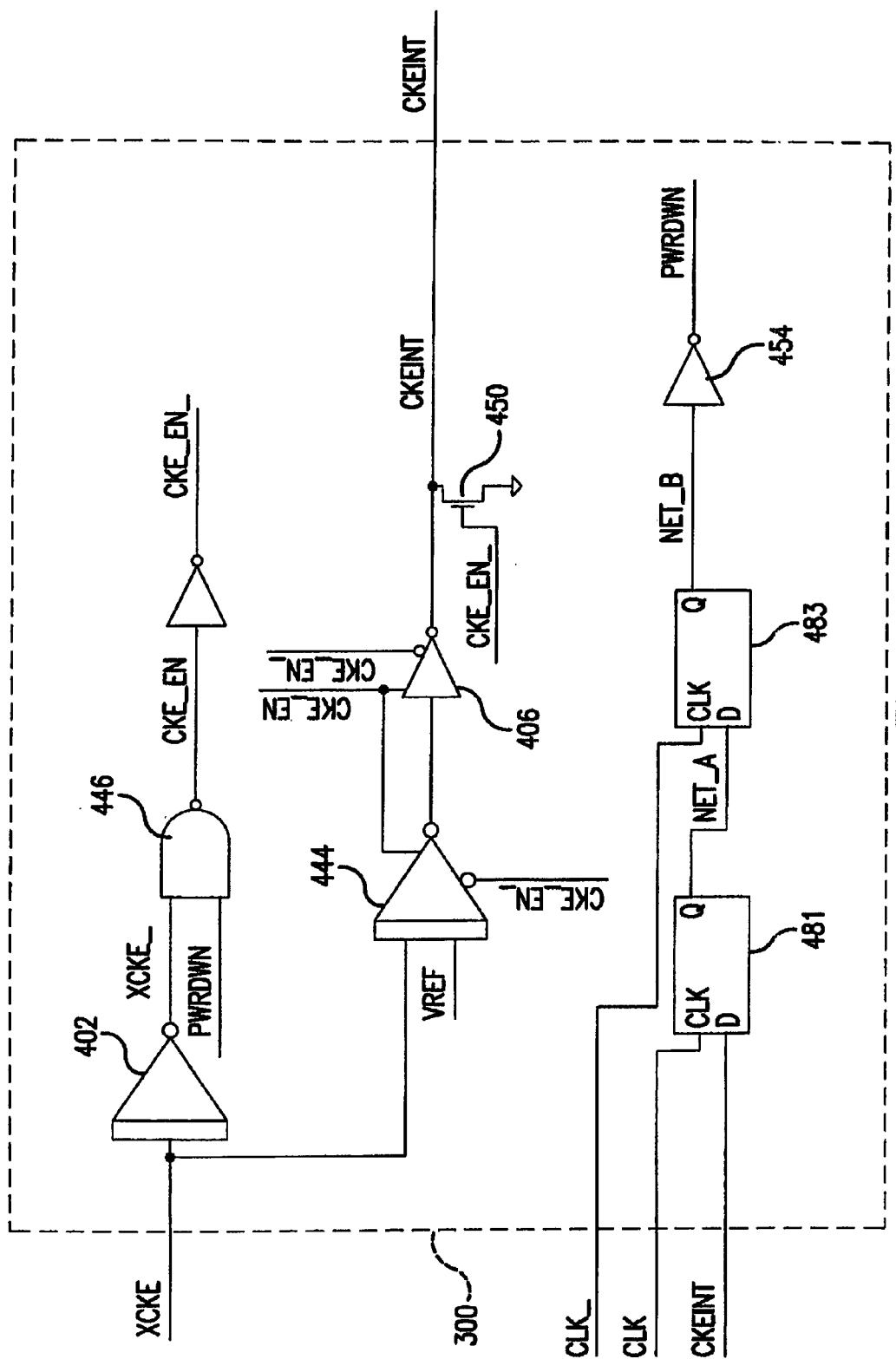
FIG. 4 is a schematic diagram depicting further detail of the first embodiment of the present invention.

A first embodiment of the invention is shown in FIGS. 3 and 4. In this embodiment the sentinel high speed buffer 212 of FIG. 2 is replaced by an internal clock enable circuit 300 within a buffer system 304 (FIG. 3). The internal clock enable circuit 300 provides an internal clock enable signal CKEINT to turn the high speed buffers 200, 204, 208 on and off during power up and sleep modes respectively. The clock enable circuit 300 contains an always on low-power CMOS buffer which detects when the CKE signal is asserted low-to-high to restore power, and a differential high speed buffer which is enabled in a power up mode and which detects when CKE transitions from high to low, thereby putting an electronic device into sleep mode to enable a fast power down. This is useful because the process of restoring power is not typically as timing-critical as the process of reducing power, thus minimizing the disadvantages of the slower response time characteristics of lower power buffers. Also, a lower power buffer consumes substantially less power than a differential buffer, which can add up to significant power savings during the sometimes long periods that memory and processor devices remain in "sleep" mode.

FIG. 4 depicts the internal clock enable circuit 300 in greater detail. Clock enable circuit 300 combines a low power buffer 402 and a differential buffer 444 which monitor an external clock enable signal XCKE. As shown in FIG. 4, the external clock enable signal XCKE enters the enable circuit 300 and the enable circuit 300 produces an internal clock enable signal CKEINT for enabling and disabling the high current buffers 200, 204, 208 (FIG. 3). The enable circuit 300 also receives a clock signal CLK and its complement CLK_.

The external clock enable signal XCKE is applied to the low power buffer 402 which is an inverter and produces the complement XCKE_signal. This signal is applied to an input of NAND gate 446 which receives as another input an internally generated PWRDWN signal. The output of the NAND gate 446 produces an internal clock enable signal CKE_EN and through inverter 447 its complement CKE_EN_. These signals are used as enable/disable signals for differential buffer 444 and a tristate inverter 406.

The differential buffer 444 receives the XCKE signal at one input, a reference voltage VREF at another input and the enable/disable signals CKE_EN and CKE_EN_. The output of differential buffer 444 is applied to tristate inverter 406 which produces the internal enable signal CKEINT at its output. The CKE_EN_ signal is also applied to the control gate of N-channel transistor 450 which selectively applies ground to the CKEINT signal line.

The enable circuit 300 uses the internal clock enable signal CKEINT to produce a PWRDWN signal used to confirm a powerdown condition. Thus, the CKEINT signal is used by flip-flop 481 under control of the CLK signal to produce an input to flip-flop 483 which under control of CLK produces a signal to inverter 454 which generates the PWRDWN signal after CKEINT is latched first by CLK and then by CLK_. Thus PWRDWN serves to confirm the presence of a valid CKEINT signal, rather than one produced by spurious conditions.

Figure 5:
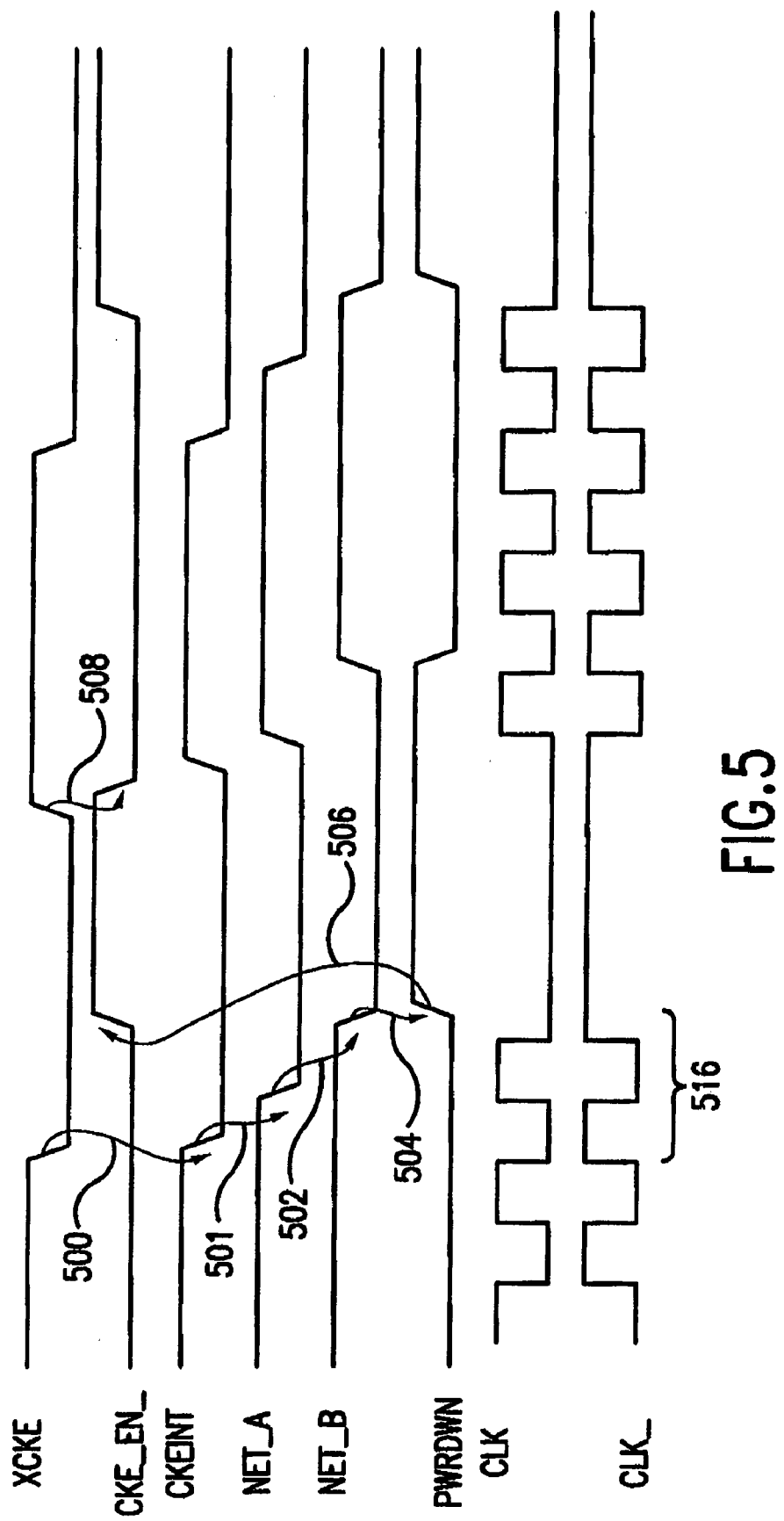
FIG. 5 is a timing diagram of the signals shown in FIG. 5.

The operation of the FIG. 4 circuit will now be explained with reference to the timing diagram of FIG. 5. The buffer 444 uses VREF as a reference to help detect the logic level of the XCKE signal. The CKE_EN_ signal is an active low signal to enable the buffer 444 after the CMOS buffer 402 has detected a XCKE high condition.

Because of the inverting CMOS buffer 402 and NAND gate 446, XCKE high will force CKE_EN to be high regardless of the state of PWRDWN. While CKE_EN is high, CKE_EN_ is low and XCKE is high, the buffer 444 is enabled providing a signal to tristate buffer 406 which causes CKEINT to be high enabling all high speed buffers 200, 204, 208. This is normal active operation.

When XCKE goes low (500), this signifies that an electronic device, e.g. a memory or processor device is about to go into power-conservation "sleep" mode. Because of NAND gate 446, CKE_EN remains high and cannot go low until after PWRDWN is high. This prevents the differential buffer 444 from accidentally being turned off due to asynchronous or spurious XCKE low conditions. The authenticity of a power down condition is verified by the PWRDWN signal. The XCKE low signal passes through the high current buffer 444 and inverter 406 to eventually become CKEINT, which is latched in flip flop 481 with CLK, then latched in flip flop 483 with CLK_, then is passed through an inverter 454 to become PWRDWN. Thus, PWRDWN is but an inverted version of CKEINT, albeit verified. The timing diagram of FIG. 5 shows the delay 516 between the CKEINT and PWRDWN signals.

When PWRDWN and XCKE are verified to be authentically high and low respectively, CKE_EN is set low thereby turning off the high current buffer 444 and placing tristate inverter 406 in a high impedance state, which in turn causes CKEINT to go low disabling all high current buffers 200, 204, 208 and saving power. In addition, the newly high CLK_EN_ turns on transistor 450 to maintain the internal enable signal CKEINT at ground after the differential buffer and tristate inverter 406 are turned off. Accordingly, all high current buffers 200, 204, 208 are disabled. When XCKE is enabled, thereby forcing an electronic device to wake up out of sleep mode, CKE_EN immediately goes high regardless of the state of PWRDWN because of NAND gate 446. FIG. 4 also shows that the outputs of flip flops 481 and 483 are labeled NET_A and NET_B, respectively. Accordingly, as shown in FIG. 5, only after CLK is high (502), and CLK_ then goes high (504), is PWRDWN then lowered.

Thus, when XCKE goes low (500), CKEINT will go low and PWRDWN will eventually go high (501, 502, and 504). The combination of PWRDWN high with XCKE low will cause CKE_EN to go low, CKE_EN_ to go high (506), the differential buffer 444 to be shut off (saving current), and the tri-state inverter 406 to be placed in a high impedance state. While in PWRDWN mode, since the buffer 444 is shut off, an N-channel transistor 450 is used to hold CKEINT low. The buffer 444 is thus held disabled until the CMOS buffer 402 detects XCKE going high again (508).

When XCKE goes high, CKE_EN will go high, CKE_EN_ will go low (508), the buffer 444 becomes enabled, the inverter 406 is enabled, and the CKEINT signal is asserted. In this way, the buffer 444 and the CMOS buffer 402 combine to respectively disable and enable high current buffers 200, 204, and 208 using the CKEINT signal.

Because the circuit of FIG. 4 employs two types of input buffers, it is possible that the lower power CMOS buffer 402 may need to be delayed. This is because the CMOS buffer 402 may be slower than the differential input buffer 444 so that XCKE may require more setup time. In other words, to initiate a power down mode, the time between XCKE rising and CLK rising to initiate normal operation would need to be greater than the time between XCKE falling and CLK rising.

Figure 6:
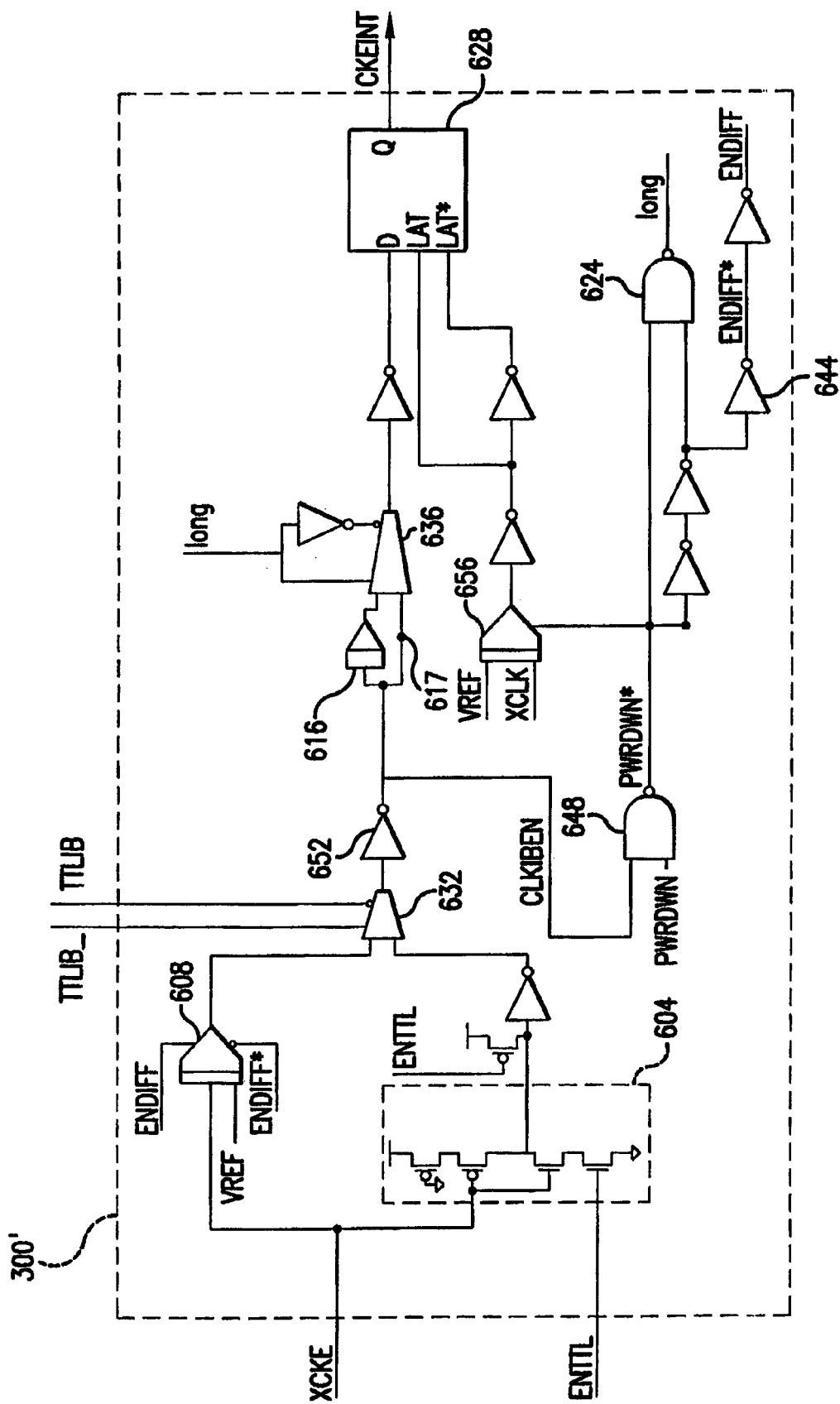
FIG. 6 is a schematic diagram of a second embodiment of the invention.

This difference in setup time is addressed within a second embodiment of the invention shown in FIG. 6. In the second embodiment, a delay scheme is incorporated in order to balance transition times through a CMOS buffer and a higher current buffer. The enable circuit 300' of FIG. 6, like the enable circuit 300 of FIG. 4, receives an external clock enable XCKE as an input and emits an internal clock enable CKEINT as an output. In the FIG. 6 embodiment, the external clock enable signal XCKE is connected to the inputs of both the CMOS buffer 604 and the differential buffer 608, and emerges from the output Q of the D-type latch 628 as the internal clock enable signal, CKEINT.

FIG. 6 also shows two signals ENTTL and ENDIFF, where the ENTTL signal is generated external to the circuit 300', while the ENDIFF signal is generated internally within the circuit 300'. When the ENTTL signal is asserted high, the lower power CMOS TTL buffer 604 becomes enabled. When the ENDIFF signal is asserted high, the differential buffer 608 becomes enabled. The signal PWRDWN is also generated external to the circuit 300'.

Under normal operating circumstances the active-high signal PWRDWN, generated by logic external to the circuit 300', is not enabled. Accordingly, because of the NAND gate 648, under normal operating circumstances the active-low signal PWRDWN* is disabled. Even when a change in status of the PWRDWN signal occurs, the PWRDWN* signal is not changed until the CLKIBEN (clock input buffer enable) signal coming out of the inverter 652 is disabled. This is because, as shown in FIG. 6, the PWRDWN signal is NAND-ed with the CLKIBEN signal to form the PWRDWN* signal. An enabled PWRDWN* causes a '0' to be present at the input of the inverter 644, which in turn outputs a '1' for the signal ENDIFF*. The signal ENDIFF* is then inverted to become ENDIFF, so that under normal operating circumstances ENDIFF is '1'. Accordingly, under any circumstance other than a PWRDWN condition the ENDIFF signal is a '1' so that the differential buffer 608 is enabled.

When a powerdown event occurs, logic external to the circuit 300' causes the active high PWRDWN signal to be asserted. This puts a logical '0' at the input of the inverter 644, which then outputs a logical '1' for the ENDIFF* signal, which corresponds to a '0' for the ENDIFF signal. Thus, when a powerdown event occurs, the signal line ENDIFF will be asserted low thereby disabling the differential buffer 608 and enabling the lower power CMOS buffer 604.

Continuing with the assumption that a powerdown event has occurred, the signal present on the external clock enable line XCKE is propagated through the lower power TTL buffer 604. The external lines TTLIB (enable TTL Input Buffer) and TTLIB_ are controlled by logic external to the circuit 300'. This external logic ensures that the signal line TTLIB is not asserted when the differential buffer 608 is in use, so that during a powerdown event the multiplexer 632 will select the output of the TTL buffer 604, and will ignore the output of the differential buffer 608. The output of the multiplexer 632 is inverted and then delivered to the multiplexer 636, which determines whether or not the delay circuit 616 is used. As stated, it is desirable to incorporate delay into the circuit 300' in order to equalize the differing transition times through the CMOS TTL buffer 604 and the higher current buffer 608, so that the circuit behaves consistently regardless of which path a signal takes.

When a powerdown event first occurs, the output of the TTL buffer 604 will be selected by the multiplexer 632 as described. This output is inverted and received both by delay circuit 616 and multiplexer 636, which decides whether to select the undelayed signal or the signal delayed by circuit 616. The multiplexer 636 makes this decision based on the active high signal "long" (FIG. 6). If the "long" signal is asserted (high), that means the TTL buffer 604 is enabled, and it is necessary to introduce delay into the signal path. Conversely, if the "long" signal is not asserted (low), that means the differential buffer 608 is enabled, and it is not necessary to introduce delay into the signal path. Because the present assumption is that a powerdown event has just occurred, the TTL buffer 604 will be enabled, so that the "long" signal will be asserted high signifying that delay is necessary. Accordingly, multiplexer 636 will select the delayed signal path present at the output of delay circuit 616, and will ignore the undelayed signal present at node 617. The output of the multiplexer 636 will then be inverted and connected to flip-flop 628, the output of which is CKEINT (Internal Clock Enable).

In the event a powerdown occurs, the active low PWRDWN* signal disables the external clock XCLK differential buffer 656, which then prevents the latching of any signal into the latch 628. Normally, the differential buffer 656 allows an external clock XCLK to latch in changes in the state of the XCKE signal. However, when PWRDWN* is enabled, the higher power differential buffer 656 is disabled, thereby saving power. Thus, at powerdown, the CKEINT signal disables the high current buffers 200, 204, 208 (FIG. 3). Through the ENDIFF signal, the differential buffer 608 will be re-enabled whenever the PWRDWN* signal is raised.

The derivation of the logical signal "long" will now be explained. As stated, the active-high signal "long" is asserted when a powerdown event occurs, because that is when the TTL buffer 604 is used and delay (long) is needed. Accordingly, as shown in FIG. 6, the PWRDWN signal generated external to the circuit 300' is inverted, then divided and connected to the two inputs of the NAND gate 624, which produces the active-high "long" signal. Thus, the "long" signal is directly related to the state of the PWRDWN signal.

Now turning to when a power-up event occurs, external to the circuit 300' the signals TTLIB and ENTLL are disabled, while the PWRDWN* signal is either disabled or has not been enabled, such as at initial powerup when the device is first turned on. The ENTTL signal going low then disables the CMOS TTL buffer 604. FIG. 6 also shows the TTLIB and TTLIB_ signals connected to the dual input multiplexer 632. As stated, the multiplexer 632 selects the output of one of the two buffers 604 or 608 to be propagated to the rest of the circuit 300', and makes that selection based on whether TTLIB or its complement TTLIB_ is asserted. Continuing the assumption that a power-up event has occurred, the CMOS TTL buffer 604 would be disabled by the ENTTL signal being lowered, while the differential buffer 608 would be enabled by the PWRDWN* signal being non-asserted. The XCKE signal would propagate through the differential buffer 608, be inverted and then received at the input of multiplexer 632, where it would be selected by the TTLIB signal being disabled during power-up. The output of the multiplexer 632 is inverted and then received at the input of the multiplexer 636. Because PWRDN* is not asserted, the "long" signal would not be active and the multiplexer 636 would choose the undelayed signal, thereby bypassing delay logic 616. The signal would then be inverted and stored in the latch 628.

The FIG. 6 circuit accounts for the fact that a signal may require introducing a delay to transition through the CMOS buffer 604, but not through the differential buffer 608. Alternatively, a separate CKE to CLK setup time can be required in the device specification. In such a case, the delay is not required.

Figure 7:
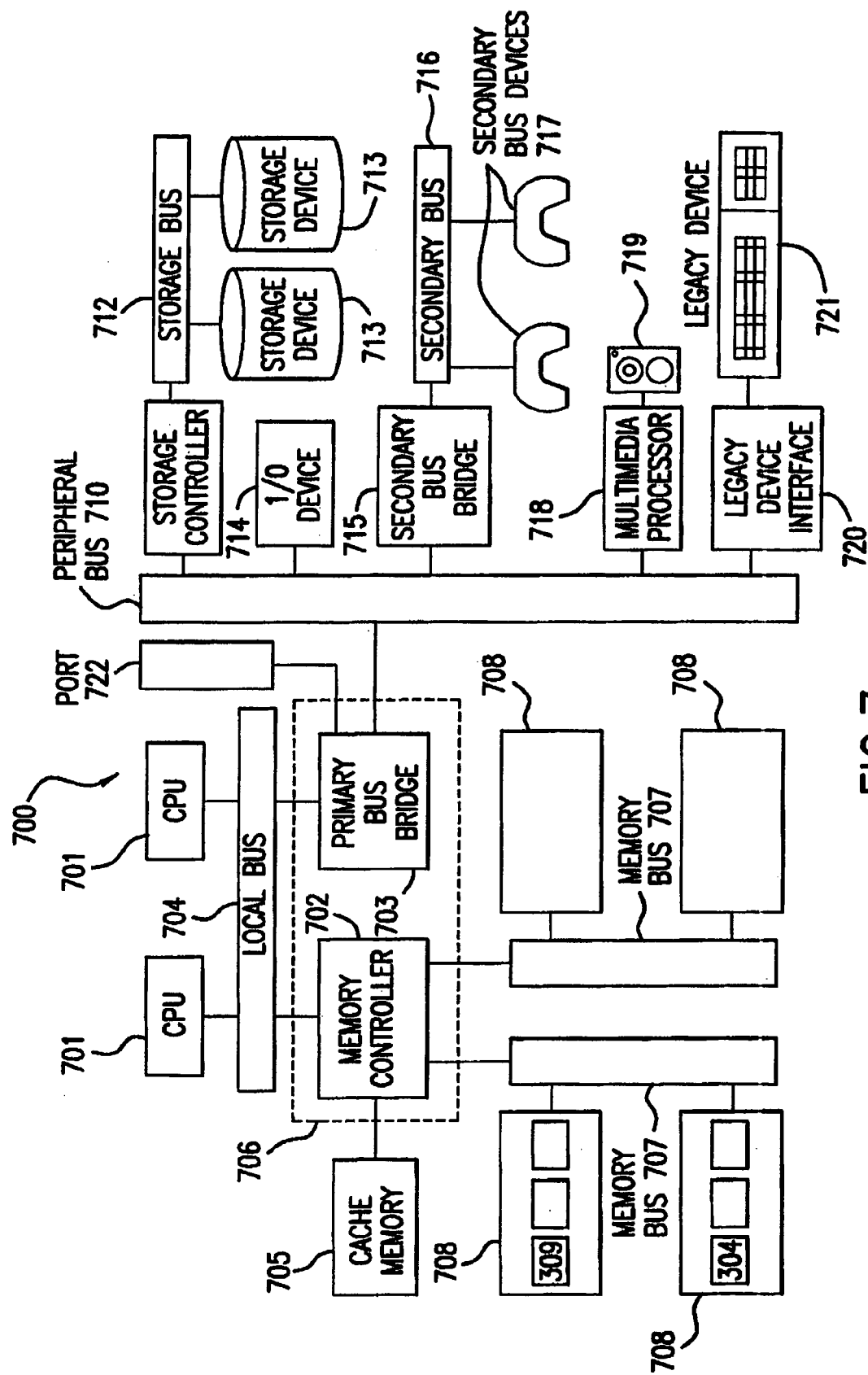
FIG. 7 shows a processor system which incorporates the invention.

FIG. 7 illustrates an exemplary processing system 700 which may utilize an electronic device incorporating the buffer system 304 of the present invention. The processing system 700 includes one or more processors 701 coupled to a local bus 704. A memory controller 702 and a primary bus bridge 703 are also coupled the local bus 704. The processing system 700 may include multiple memory controllers 702 and/or multiple primary bus bridges 703. The memory controller 702 and the primary bus bridge 703 may be integrated as a single device 706.

The memory controller 702 is also coupled to one or more memory buses 707. Each memory bus accepts memory components 708 which include at least one buffer device 304 of the present invention. The memory components 708 may be a memory card or a memory module. Examples of memory modules include single inline memory modules (SIMMs) and dual inline memory modules (DIMMs). The memory components 708 may include one or more additional devices 709. For example, in a SIMM or DIMM, the additional device 709 might be a configuration memory, such as a serial presence detect (SPD) memory. The memory controller 702 may also be coupled to a cache memory 705. The cache memory 705 may be the only cache memory in the processing system. Alternatively, other devices, for example, processors 701 may also include cache memories, which may form a cache hierarchy with cache memory 705. If the processing system 700 include peripherals or controllers which are bus masters or which support direct memory access (DMA), the memory controller 702 may implement a cache coherency protocol. If the memory controller 702 is coupled to a plurality of memory buses 707, each memory bus 707 may be operated in parallel, or different address ranges may be mapped to different memory buses 707.

The primary bus bridge 703 is coupled to at least one peripheral bus 710. Various devices, such as peripherals or additional bus bridges may be coupled to the peripheral bus 710. These devices may include a storage controller 711, an miscellaneous I/O device 714, a secondary bus bridge 715, a multimedia processor 718, and an legacy device interface 720. The primary bus bridge 703 may also coupled to one or more special purpose high speed ports 722. In a personal computer, for example, the special purpose port might be the Accelerated Graphics Port (AGP), used to couple a high performance video card to the processing system 700.

The storage controller 711 couples one or more storage devices 713, via a storage bus 712, to the peripheral bus 710. For example, the storage controller 711 may be a SCSI controller and storage devices 713 may be SCSI discs. The I/O device 714 may be any sort of peripheral. For example, the I/O device 714 may be an local area network interface, such as an Ethernet card. The secondary bus bridge may be used to interface additional devices via another bus to the processing system. For example, the secondary bus bridge may be an universal serial port (USB) controller used to couple USB devices 717 via to the processing system 700. The multimedia processor 718 may be a sound card, a video capture card, or any other type of media interface, which may also be coupled to one additional devices such as speakers 719. The legacy device interface 720 is used to couple legacy devices, for example, older styled keyboards and mice, to the processing system 700.

The processing system 700 illustrated in FIG. 7 is only an exemplary processing system with which the invention may be used. While FIG. 7 illustrates a processing architecture especially suitable for a general purpose computer, such as a personal computer or a workstation, it should be recognized that well known modifications can be made to configure the processing system 700 to become more suitable for use in a variety of applications. For example, many electronic devices which require processing may be implemented using a simpler architecture which relies on a CPU 701 coupled to memory components 708 and/or memory buffer devices 304. These electronic devices may include, but are not limited to audio/video processors and recorders, gaming consoles, digital television sets, wired or wireless telephones, navigation devices (including system based on the global positioning system (GPS) and/or inertial navigation), and digital cameras and/or recorders. The modifications may include, for example, elimination of unnecessary components, addition of specialized devices or circuits, and/or integration of a plurality of devices.

While the invention has been described and illustrated with reference to specific exemplary embodiments, it should be understood that many modifications and substitutions can be made without departing from the spirit and scope of the invention. Accordingly, the invention is not to be considered as limited by the foregoing description but is only limited by the scope of the appended claims.

What is claimed is:

1. A buffer circuit for detecting a power up condition, comprising:
   a plurality of first higher power buffers, each connected to buffer respective signal lines;
   a lower power buffer for detecting a power up condition and for enabling the plurality of first higher power buffers when a power up condition is detected; and
   a second higher power buffer for detecting a power down condition and for disabling the plurality of first higher power buffers when a power down condition is detected.

2. The buffer circuit of claim 1, wherein the first and second higher power buffers are differential buffers.

3. The buffer circuit claim 1, wherein the lower power buffer is a CMOS inverter.

4. The buffer circuit of claim 1, wherein the lower power buffer detects a transition in a clock enable signal indicating power up, and the second higher power buffer detects a transition of a clock enable signal indicating power down.

5. The buffer circuit of claim 4,
wherein the lower and second higher power buffers are provided within logic circuitry, said logic circuitry for transforming an external clock enable signal into an internal signal for enabling and disabling the plurality of first higher power buffers, and
wherein the logic circuitry further comprises a selectable delay circuit for equalizing buffer transition time, and for permitting the logic circuitry to selectively introduce a delay when the lower power buffer is operable.

6. The buffer circuit of claim 5, wherein the logic circuitry further comprises an NMOS transistor operated by a signal derived from the external clock enable signal for stabilizing the internal clock signal during a power down condition.

7. The buffer circuit of claim 5, wherein the logic circuitry verifies the authenticity of the internal clock signal.

8. The buffer circuit of claim 1, wherein the respective signal lines comprise address lines.

9. The buffer circuit of claim 1, wherein the respective signal lines comprise command lines.

10. The buffer circuit of claim 1, wherein the respective signal lines comprise clock lines.

11. The buffer circuit of claim 1, wherein the respective signal lines comprise data lines.

12. The buffer circuit of claim 5 wherein the lower power buffer and the second higher power buffer monitor an enable input signal, and wherein the logic circuitry has a first setup time requirement for a power up condition, and a second setup time requirement for a power down signal.

13. A method of detecting the state of a clock enable signal, comprising:
detecting a power up condition with a lower power buffer;
enabling a plurality of first higher power buffers, each connected to buffer respective signal lines, upon detection of the power up condition by the lower power buffer;
detecting a power down condition with a second higher power buffer; and
disabling the plurality of first higher power buffers when a power down condition is detected by the second higher power buffer.

14. The method of claim 13, wherein the lower power buffer is a CMOS inverter.

15. The method of claim 14, wherein the lower power buffer detects a transition in a clock enable signal indicating power up.

16. The method of claim 13, further comprising:
transforming an external clock enable signal into an internal clock signal suitable for connecting to the plurality of first higher power buffers, and
verifying the authenticity of the internal clock signal.

17. A circuit for detecting a power up or power down condition, comprising:
a plurality of first higher power buffers, each connected to respective signal lines;
a lower power buffer, for detecting a power up condition and for enabling the plurality of first higher power buffers when a power up condition is detected;
a second higher power buffer, for detecting a power down condition and for disabling the plurality of first higher power buffers when a power down condition is detected; and
logic circuitry for transforming an external clock enable signal into an internal signal suitable for the plurality of first higher power buffers, the logic circuitry comprising a delay circuit for delaying the propagation of a signal from the lower power buffer as it passes through the logic circuitry wherein the delay circuit does not delay the propagation of a signal from the second higher power buffer.

18. The detection circuit of claim 17, wherein said first and second higher power buffers are differential buffers.

19. The detection circuit of claim 17, wherein the lower power buffer is a CMOS inverter.

20. The detection circuit of claim 17, wherein the lower power buffer detects a transition in a clock enable signal indicating power up, and the second higher power buffer detects a transition of a clock enable signal indicating power down.

21. The detection circuit of claim 17, wherein the logic circuitry verifies the authenticity of the internal clock signal.

22. The detection circuit of claim 17, wherein the lower power buffer and the second higher power buffer monitor an enable input signal, and the logic circuitry has a first setup time requirement for a power up condition, and a second setup time requirement for a power down signal.

23. A processor circuit, comprising:
a processor and a memory circuit for exchanging data with said processor wherein at least one of said processor and memory circuit comprises a buffer circuit, said buffer circuit comprising
a plurality of first higher power buffers, each connected to buffer respective signal lines,
a lower power buffer, for detecting a power up condition and for enabling the first higher power buffers when a power up condition is detected, and
a second higher power buffer, for detecting a power down condition and for disabling the plurality of second higher power buffers when a power down condition is detected.

24. The processor circuit of claim 23, wherein the first and second higher power buffers are differential buffers.

25. The processor circuit claim 23, wherein the lower power buffer is a CMOS inverter.

26. The processor circuit of claim 23, wherein the lower power buffer detects a transition in a clock enable signal indicating power up, and the second higher power buffer detects a transition of a clock enable signal indicating power down.

27. The processor circuit of claim 23,
wherein the lower and second higher power buffers for detecting power up and power down conditions are provided within logic circuitry which transforms an external clock enable signal into an internal signal for enabling and disabling the plurality of first higher power buffers, and
wherein the logic circuitry further comprises a selectable delay circuit for equalizing buffer transition time, and for permitting the logic circuitry to selectively introduce a delay when the lower power buffer is operable.

28. The processor circuit of claim 27, wherein the logic circuitry further comprises an NMOS transistor operated by a signal derived from the external clock enable signal for stabilizing the internal clock signal during a power down condition.

29. The processor circuit of claim 27, wherein the logic circuitry verifies the authenticity of the internal clock signal.

30. The processor circuit of claim 27, wherein the lower power buffer and the second higher power buffer monitor an enable input signal, and the logic circuitry has a first setup time requirement for a power up condition, and a second setup time requirement for a power down signal.

* * * * *

UNITED STATES PATENT AND TRADEMARK OFFICE
CERTIFICATE OF CORRECTION

PATENT NO. : 6,941,526 B2
DATED : September 6, 2005
INVENTOR(S) : Schoenfeld et al.

It is certified that error appears in the above-identified patent and that said Letters Patent is hereby corrected as shown below:

Column 8,
Lines 1-2, "an miscellaneous" should read -- a miscellaneous --;
Line 3, "an legacy" should read -- a legacy --;
Line 14, "an local" should read -- a local --;
Line 18, "an universal" should read -- a universal --;
Line 22, "to one" should read -- to --; and
Line 40, "system" should read -- systems --.

Signed and Sealed this

Sixth Day of December, 2005

JON W. DUDAS
*Director of the United States Patent and Trademark Office*